(12) United States Patent
Usui

(10) Patent No.: US 9,633,931 B2
(45) Date of Patent: Apr. 25, 2017

(54) CHIP ROTATED AT AN ANGLE MOUNTED ON DIE PAD REGION

(71) Applicant: ROHM CO., LTD., Ukyo-ku, Kyoto (JP)

(72) Inventor: Hirotoshi Usui, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/136,128

(22) Filed: Apr. 22, 2016

(65) Prior Publication Data

US 2016/0240458 A1 Aug. 18, 2016

Related U.S. Application Data

(63) Continuation of application No. 14/712,146, filed on May 14, 2015, now Pat. No. 9,349,676.

(30) Foreign Application Priority Data

May 15, 2014 (JP) .................................. 2014-101211

(51) Int. Cl.
*H01L 23/495* (2006.01)
*H05K 7/18* (2006.01)
(Continued)

(52) U.S. Cl.
CPC .... *H01L 23/4952* (2013.01); *H01L 23/49503* (2013.01); *H01L 23/49537* (2013.01); *H01L 23/49541* (2013.01); *H01L 23/49548* (2013.01); *H01L 23/49838* (2013.01); *H01L 24/42* (2013.01); *H01L 24/46* (2013.01);
(Continued)

(58) Field of Classification Search
CPC ........... H01L 23/4952; H01L 23/49503; H01L 23/49537; H01L 23/49541; H01L 23/49548; H01L 24/42; H01L 24/46; H01L 24/49; H01L 24/84
See application file for complete search history.

(56) References Cited

U.S. PATENT DOCUMENTS 5,126,823 A * 6/1992 Otsuka .............. H01L 23/49575
257/666
5,410,182 A * 4/1995 Kurafuchi ............... H01L 23/13
257/692
(Continued)

FOREIGN PATENT DOCUMENTS

JP 10135399 A 5/1998

OTHER PUBLICATIONS

US Non-Final Office Action corresponding to U.S. Appl. No. 14/712,146; Date of Mailing: Aug. 10, 2015.

*Primary Examiner* — Alonzo Chambliss
(74) *Attorney, Agent, or Firm* — Cantor Colburn LLP

(57) ABSTRACT

A package includes: a plurality of lead frames configured to extend inwardly from an outer circumferential portion of the package; a die pad region surrounded with the lead frames in a plane view; a semiconductor chip mounted on the die pad region; a plurality of bonding pads disposed on the semiconductor chip; and a plurality of bonding wires configured to connect the lead frames and the bonding pads, respectively, wherein the bonding wires are respectively connected to front end portions of the lead frames by bonding with an angle ranging from 45 to 135 degrees with respect to a trace of front end portions of the lead frames in the plane view.

5 Claims, 13 Drawing Sheets

(51) Int. Cl.
  *H01L 21/00* (2006.01)
  *H01L 23/00* (2006.01)
  *H01L 23/498* (2006.01)

(52) U.S. Cl.
  CPC .............. *H01L 24/49* (2013.01); *H01L 24/85* (2013.01); *H01L 2224/05554* (2013.01); *H01L 2224/48091* (2013.01); *H01L 2224/4909* (2013.01); *H01L 2224/4912* (2013.01); *H01L 2224/49171* (2013.01); *H01L 2924/00014* (2013.01); *H01L 2924/386* (2013.01)

(56) References Cited

U.S. PATENT DOCUMENTS

| | | | |
|---|---|---|---|
| 5,640,044 A | | 6/1997 | Takehashi et al. |
| 6,133,637 A | * | 10/2000 | Hikita .................... G01P 3/488 257/666 |
| 6,239,366 B1 | * | 5/2001 | Hsuan ................ H01L 23/3135 174/524 |
| 6,476,474 B1 | * | 11/2002 | Hung ................ H01L 23/49575 257/493 |
| 7,855,445 B2 | * | 12/2010 | Landry ................... H01L 24/06 257/686 |
| 8,188,582 B2 | | 5/2012 | Seo |
| 8,253,238 B2 | | 8/2012 | Satoh et al. |
| 8,487,452 B2 | | 7/2013 | Lee et al. |
| 9,349,676 B2 | * | 5/2016 | Usui ................ H01L 23/49537 |
| 2011/0068442 A1 | | 3/2011 | Satoh et al. |

\* cited by examiner

CHIP ROTATED AT AN ANGLE MOUNTED ON DIE PAD REGION

CROSS-REFERENCE TO RELATED APPLICATION

The present application is a continuation application of U.S. patent application Ser. No. 14/712,146, filed on May 14, 2015, the entire contents of which are incorporated herein by reference and priority to which is hereby claimed. application Ser. No. 14/712,146 is based upon and claims the benefit of priority under 35 U.S.C. §119(a) and 35 U.S.C. §365(b) from Japanese Patent Application No. 2014-101211, filed on May 15, 2014, the disclosure of which is also incorporated herein by reference.

TECHNICAL FIELD

The present disclosure relates to a package, and more particularly relates to a package in which an adjacent short-circuit can be prevented.

BACKGROUND

In general, a quad flat package (QFP) has widely been known as a semiconductor integrated circuit package having multiple pins. Recently, even such a QFP is required to have multiple pins and leads at narrow pitches.

A semiconductor device in which wires are prevented from being in contact with each other at narrow pitches between leads has been disclosed.

When a size of a large scale integration (LSI) chip is close to a size available to be mounted as an LSI chip of a package, acute angle wire bonding is required. As an LSI chip increases in size, angles of bonded wires are more acute in a direction toward an end of the chip. As a result, a distance between bonding wires and a lead frame adjacent to each other or a distance between adjacent bonding wires is reduced, generating a risk of a short-circuit defect.

SUMMARY

The present disclosure provides some embodiments of a package in which an adjacent short-circuit can be prevented.

According to an embodiment of the present disclosure, there is provided a package, including: a plurality of lead frames configured to extend inwardly from an outer circumferential portion of the package; a die pad region surrounded with the lead frames in a plane view; a semiconductor chip mounted on the die pad region; a plurality of bonding pads disposed on the semiconductor chip; and a plurality of bonding wires configured to connect the lead frames and the bonding pads, respectively, wherein the bonding wires are respectively bonded to front end portions of the lead frames at angles ranging from 45 to 135 degrees with respect to a trace of front end portions of the lead frames in the plane view.

DETAILED DESCRIPTION

Figure 1:
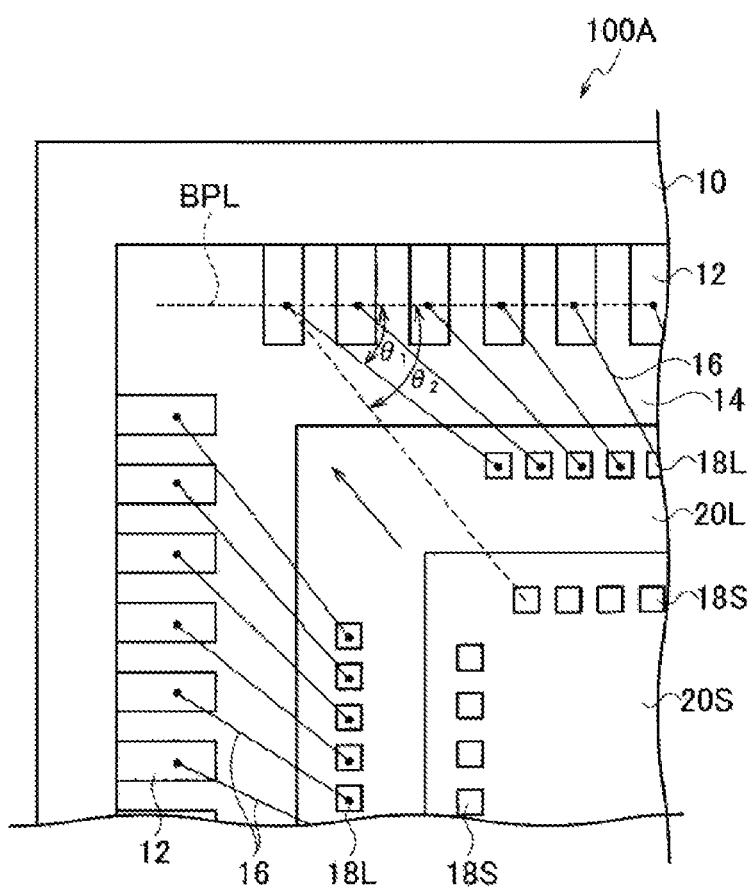
FIG. 1 is an enlarged schematic plane view of a corner portion of a package according to Comparative Example 1.

Hereinafter, embodiments will be described with reference to the drawings. In the descriptions of the following drawings, the same or similar reference numerals are given to the same or similar components. However, the drawings are schematic, and it should be noted that relationships between thicknesses and planar dimensions, ratios of thicknesses of layers, and the like are different from those that are practical. Thus, specific thicknesses or dimensions should be determined in consideration of the following descriptions. Further, it to be understood that the drawings include portions in which mutual dimension relationships and ratios are different.

Moreover, the following embodiments are provided to illustrate apparatuses or methods for embodying the technical concept of the present disclosure, and, in the embodiments of the present disclosure, materials, configurations, structures, and arrangements of components are not limited to the followings. The embodiments of the present disclosure may be variously modified in claims.

Further, in the following descriptions, a portion described as a "package" may also have the same meaning as an "interior of package".

COMPARATIVE EXAMPLES

Comparative Example 1

A schematic planar configuration in which corner portions are enlarged in a package 100A according to Comparative Example 1 is illustrated in FIG. 1.

As illustrated in FIG. 1, the package 100A according to Comparative Example 1 includes a plurality of lead frames 12 configured to extend inwardly from an outer circumferential portion 10 of the package, a die pad region 14 surrounded by the lead frames 12 in a plane view, semiconductor chips 20L and 20S mounted on the die pad region 14, a plurality of bonding pads 18L and 18S disposed on the semiconductor chips 20L and 20S, respectively, and a plurality of bonding wires 16 configured to connect the lead frames 12 and the bonding pads 18L and 18S, respectively.

Here, the semiconductor chips 20L and 20S indicate relatively large and small chip sizes, respectively. The bonding wires 16 have angles of, e.g., $\theta_1$ and $\theta_2$, for the semiconductor chips 20L and 20S, with respect to a trace BPL of front end portions of the lead frames 12 in the plane view. Here, a relationship of $\theta_1 < \theta_2$ is established.

In the package 100A according to Comparative Example 1, as an LSI chip increases in size, angles of the bonded wires 16 are more acute in a direction toward an end of the chip. As a result, as illustrated in FIG. 1, a distance between the bonding wires and the lead frame adjacent to each other or a distance between adjacent bonding wires is reduced, generating a risk of a short-circuit defect. When the size of the LSI chip is close to a size available to be mounted as an LSI chip of a package, acute angle wire bonding is required.

Comparative Example 2

Figure 2:
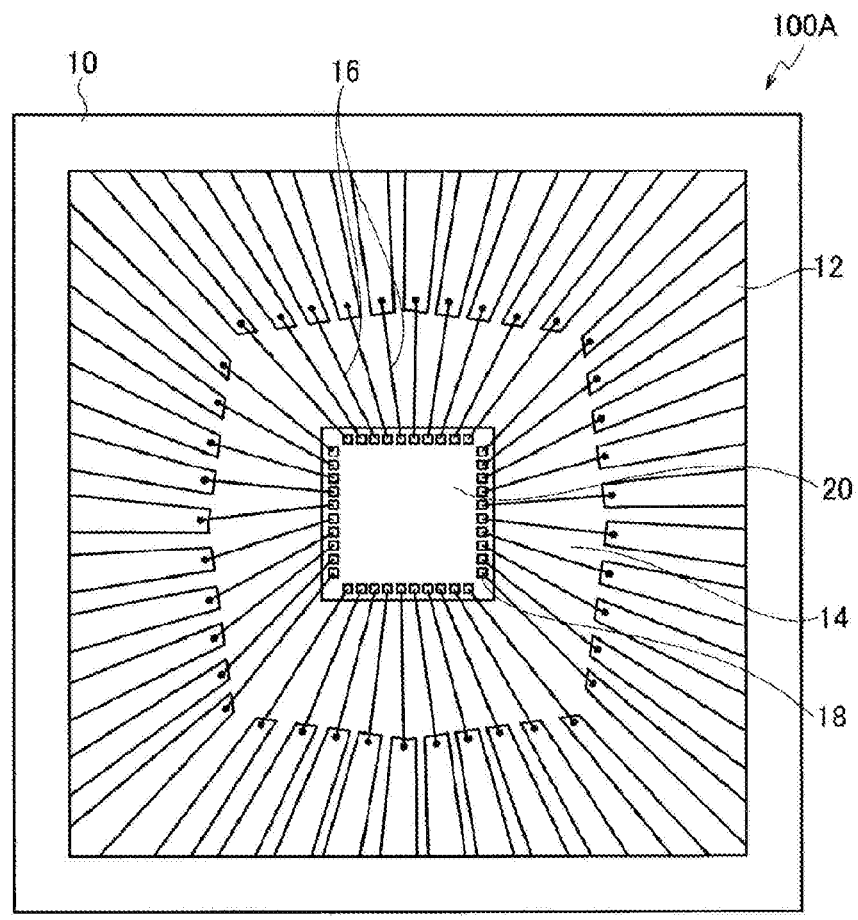
FIG. 2 is a schematic plane view of a package according to Comparative Example 2.

A schematic planar configuration of a package 100A according to Comparative Example 2 is illustrated in FIG. 2.

As illustrated in FIG. 2, the package 100A according to Comparative Example 2 includes a plurality of lead frames 12 configured to extend inwardly from an outer circumferential portion 10 of the package, a die pad region 14 surrounded with the lead frames 12 in the plane view, a semiconductor chip 20 mounted on the die pad region 14, a plurality of bonding pads 18 disposed on the semiconductor chip 20, and a plurality of bonding wires 16 configured to connect the lead frames 12 and the bonding pads 18, respectively.

Here, a trace of front end portions of the lead frames 12 is alleviated with angles with respect to the sides of the semiconductor chip 20. However, in the trace of the front end portions of the lead frames 12 in the plan view, the bonding wires 16 have an acute angle in the corner portions. Further, the bonding wires 16 are the same as those of Comparative Example 1 in that, as the LSI chip increases in size, angles of the bonded wires are more acute in a direction toward the end of the LSI chip.

Comparative Example 3

Figure 3:
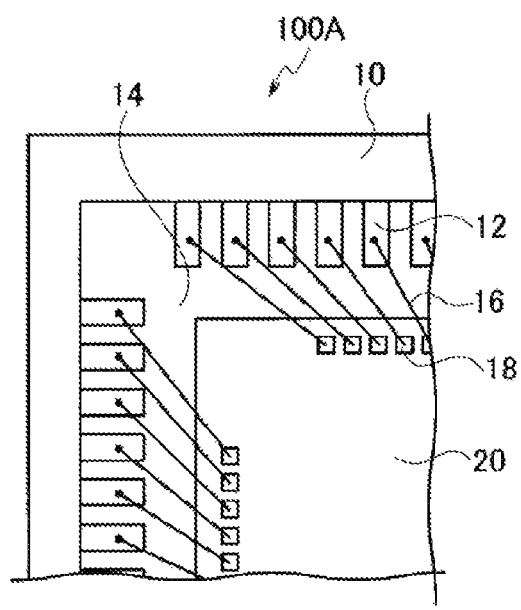
FIG. 3 is an enlarged schematic plane view of a corner portion of a package according to Comparative Example 3.

A schematic planar configuration in which corner portions are enlarged in a package 100A according to Comparative Example 3 is illustrated in FIG. 3. Further, a schematic aerial structure of the package 100A according to Comparative Example 3 is illustrated in FIG. 4.

Figure 4:
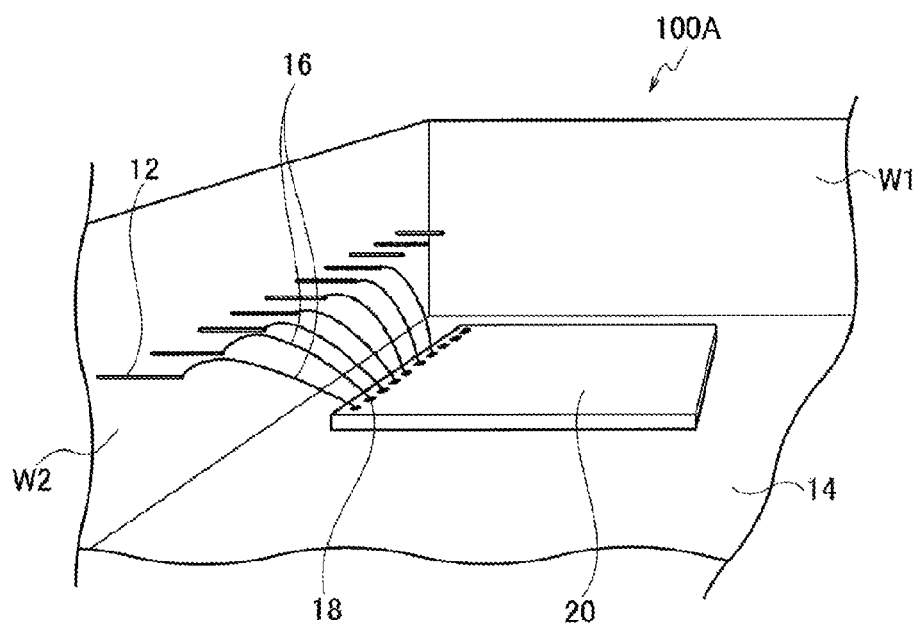
FIG. 4 is a schematic aerial view of the package according to Comparative Example 3.
Figure 5:
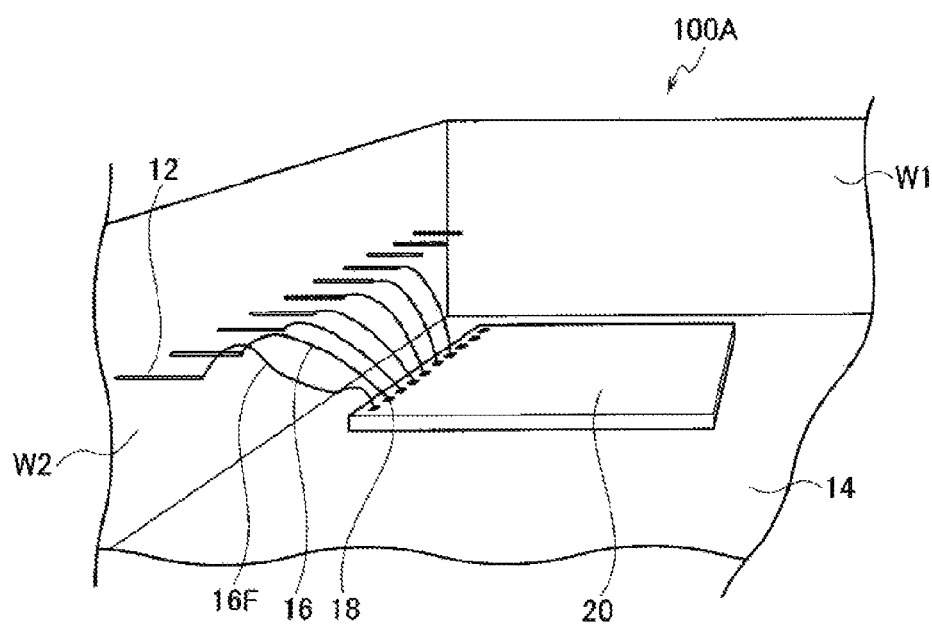
FIG. 5 is a schematic aerial view of the package according to Comparative Example 3.

As illustrated in FIGS. 3 to 5, the package 100A according to Comparative Example 3 includes a plurality of lead frames 12 configured to extend inwardly from an outer circumferential portion 10 of the package, a die pad region 14 surrounded with the lead frames 12 in the plane view, a semiconductor chip 20 mounted on the die pad region 14, a plurality of bonding pads 18 disposed on the semiconductor chip 20, and a plurality of bonding wires 16 configured to connect the lead frames 12 and the bonding pads 18, respectively.

Further, a schematic aerial structure of the package 100A according to Comparative Example 3 is illustrated in FIG. 4. In FIG. 4, a plurality of lead frames 12 are disposed on a lead frame wall surface W2, and a plurality of bonding wires 16 are connected between the lead frames 12 and the bonding pads 18, respectively. Further, a plurality of lead frames 12 are also disposed on a lead frame wall surface W1 but omitted in illustration.

In the package 100A according to Comparative Example 3, since a size of the LSI chip is relatively large, angles of the bonded wires 16 are more acute in a direction toward the end of the side of the semiconductor chip 20. As a result, as illustrated in FIG. 3, a distance between the bonding wires and the lead frame adjacent to each other or a distance between adjacent bonding wires is reduced, generating a risk of a short-circuit defect.

An example in which a schematic aerial structure of the package according to Comparative Example 3 has a defective bonding wire 16F is illustrated in FIG. 5. As shown, bending of the bonding wire causes the distance between the bonding wires and the lead frame adjacent to each other or a distance between adjacent bonding wires to be reduced, generating a risk of a short-circuit defect.

Comparative Example 4

Figure 6:
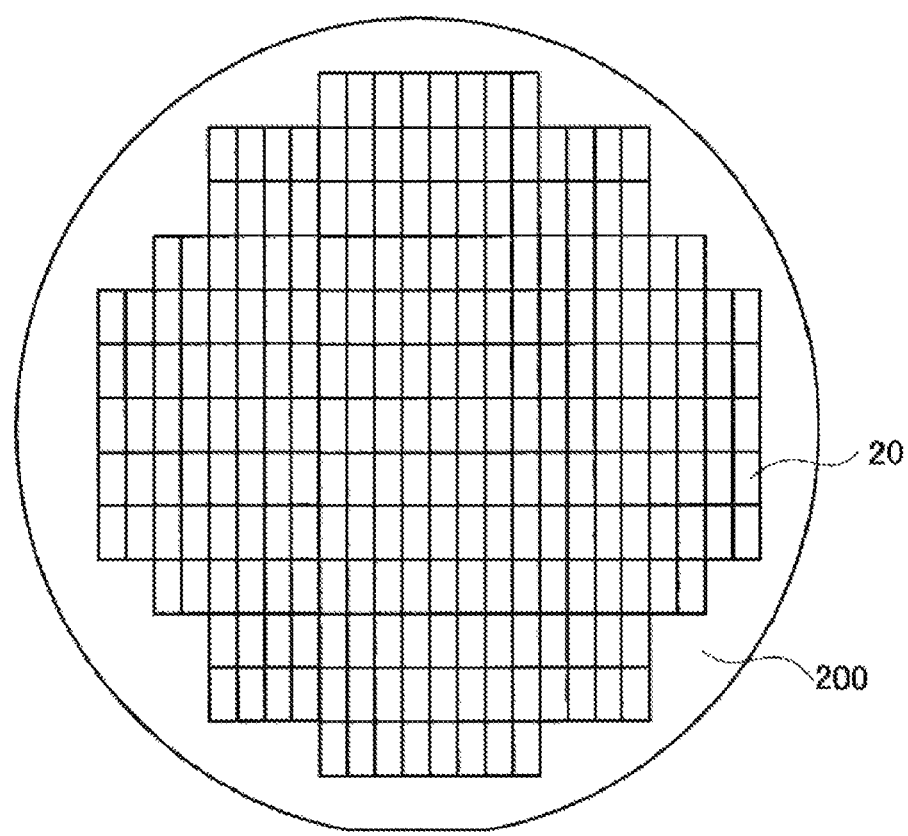
FIG. 6 is a layout view illustrating an example of semiconductor chips mounted in a rectangular package on a wafer according to Comparative Example 3.
Figure 7:
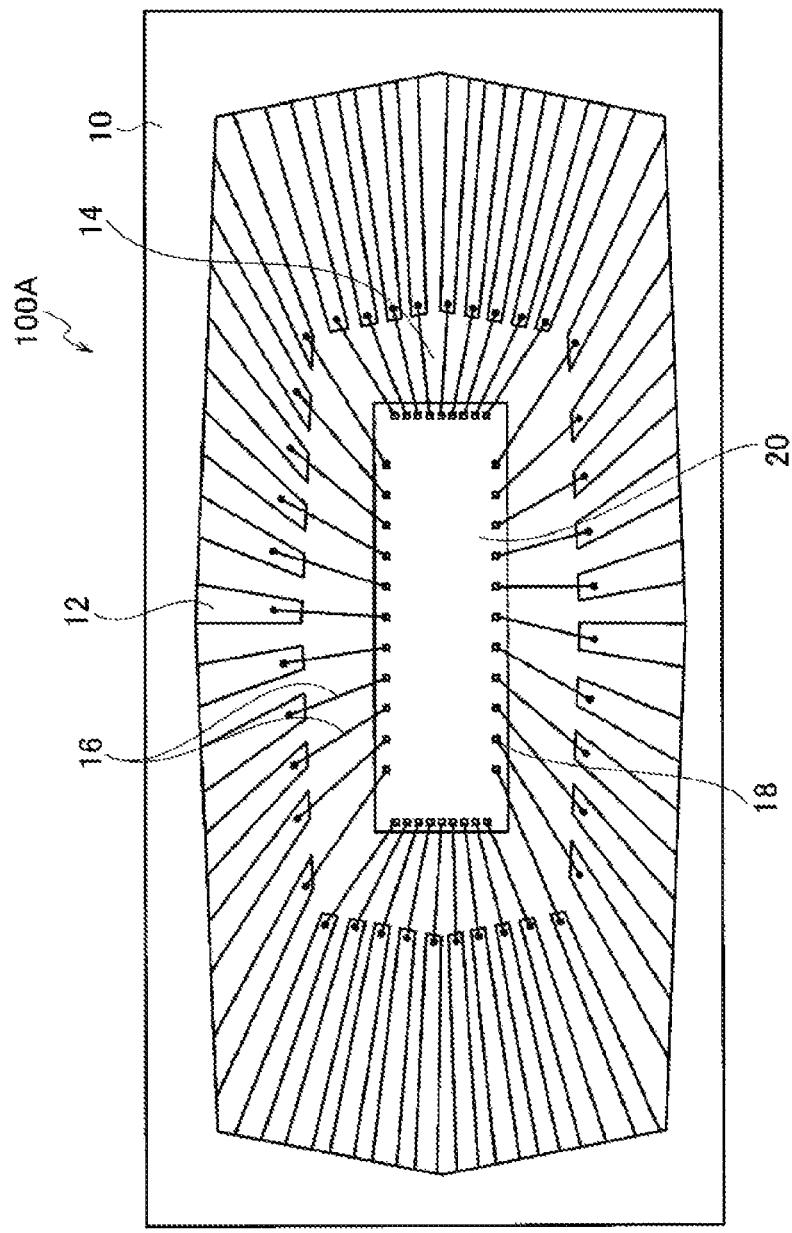
FIG. 7 is a schematic plane view of the rectangular package according to Comparative Example 3.

A layout example of a semiconductor chip 20 mounted on a rectangular package 100A in a semiconductor wafer 200 according to Comparative Example 4 is illustrated in FIG. 6. Further, a schematic planar configuration of the rectangular package 100A according to Comparative Example 4 is illustrated in FIG. 7. Since the semiconductor chip 20 mounted on the rectangular package 100A according to Comparative Example 4 has a rectangular shape, the semiconductor chip 20 may be cut out from the semiconductor wafer 200 through a scribing process as illustrated in FIG. 6.

As illustrated in FIG. 7, the package 100A according to Comparative Example 4 includes a plurality of lead frames 12 configured to extend inwardly from an outer circumferential portion 10 of the package, a die pad region 14 surrounded with the lead frames 12 in the plane view, a semiconductor chip 20 mounted on the die pad region 14, a plurality of bonding pads 18 disposed on the semiconductor chip 20, and a plurality of bonding wires 16 configured to connect the lead frames 12 and the bonding pads 18, respectively.

Also, in the package 100A according to Comparative Example 4, angles of the bonded wires 16 are more acute in a direction toward the end of a longer side of the rectangular LSI chip. As a result, as illustrated in FIG. 7, a distance between the bonding wires and the lead frame adjacent to each other or a distance between adjacent bonding wires is reduced to generate a risk of a short-circuit defect.

(First Embodiment)

Figure 8:
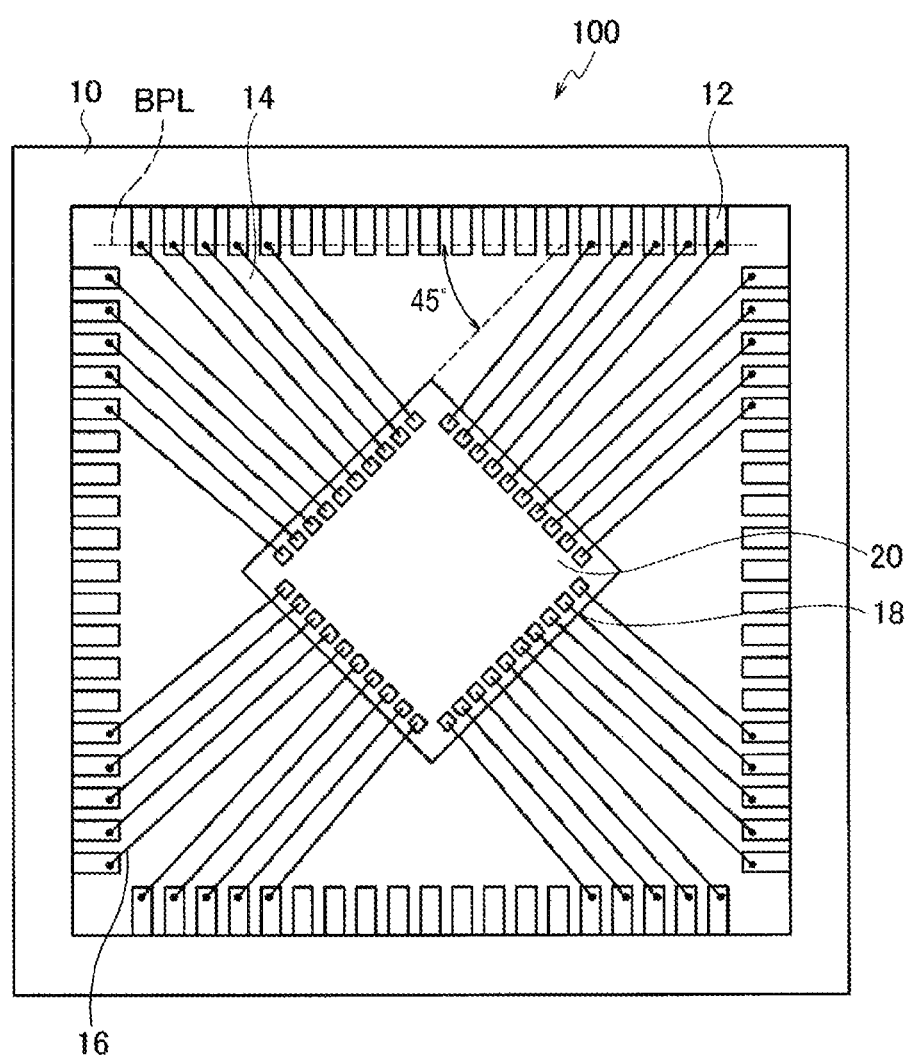
FIG. 8 is a schematic plane view of a package according to a first embodiment.
Figure 9:
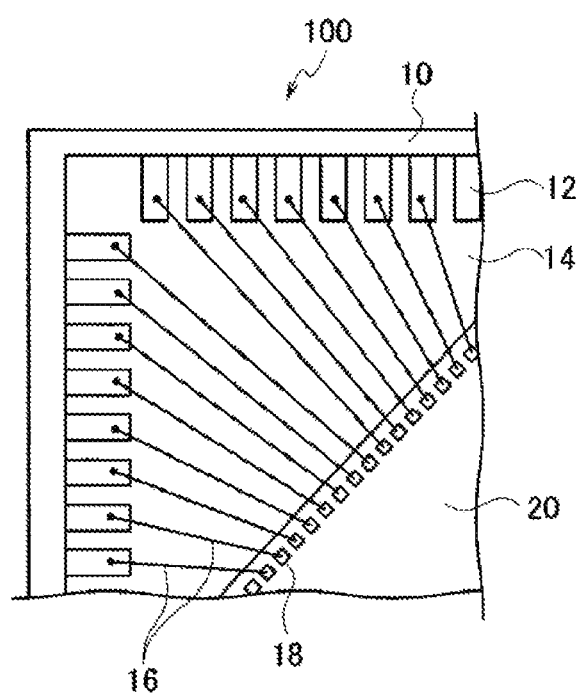
FIG. 9 is an enlarged schematic plane view of a corner portion of the package according to the first embodiment.

A schematic planar configuration of a package 100 according to a first embodiment is illustrated in FIG. 8, and a schematic planar configuration in which corner portions are enlarged in the package 100 according to the first embodiment is illustrated in FIG. 9.

As illustrated in FIGS. 8 and 9, the package 100 according to the first embodiment includes a plurality of lead frames 12 configured to extend inwardly from an outer circumferential portion 10 of the package, a die pad region 14 surrounded with the lead frames 12 in the plane view, a semiconductor chip 20 mounted on the die pad region 14, a plurality of bonding pads 18 disposed on the semiconductor chip 20, and a plurality of bonding wires 16 configured to connect the lead frames 12 and the bonding pads 18, respectively. Here, the bonding wires 16 are respectively bonded to the front end portions of the lead frames 12 at angles ranging from 45 to 135 degrees with respect to a trace of the front end portions of the lead frames 12 in the plane view.

Figure 11:
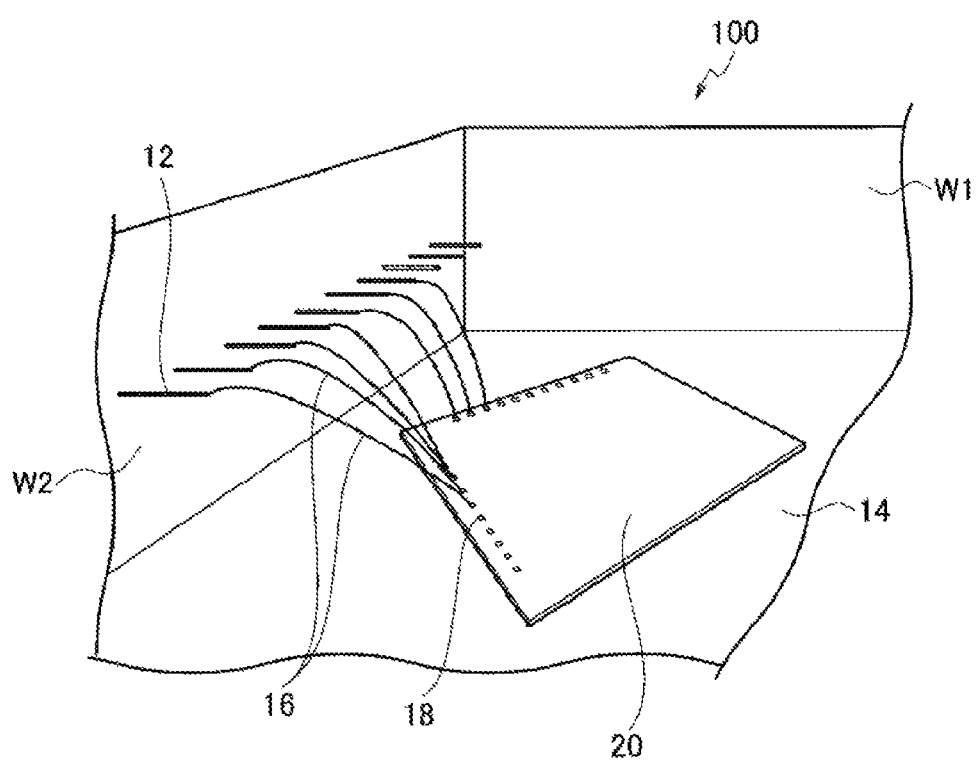
FIG. 11 is a schematic aerial view of the package according to the first embodiment.

Further, a schematic aerial structure of the package 100 according to the first embodiment is illustrated in FIG. 11. In FIG. 11, a plurality of lead frames 12 are disposed on a lead frame wall surface W2, and a plurality of bonding wires 16 are connected between the lead frames 12 and the bonding pads 18, respectively. Further, a plurality of lead frames 12 are also disposed on a lead frame wall surface W1 but omitted in illustration.

In addition, the sides of the semiconductor chip 20 may be placed to have an acute angle equal to or smaller than 45 degrees with respect to the trace of the front end portions of the lead frames 12 in the plane view.

Further, as illustrated in FIGS. 8 and 9, the die pad region 14 and the semiconductor chip 20 may have a square shape in the plane view.

Further, as illustrated in FIGS. 8 and 9, the semiconductor chip 20 may be disposed at a 45 degree angle with respect to the trace of the front end portions of the lead frames in the plane view.

Further, as illustrated in FIGS. 8 and 9, the trace of the bonded pads 18 may be disposed at a 45 degree angle with respect to the trace of the front end portions of the lead frames 12 in the plane view.

(Modifications)

Figure 10:
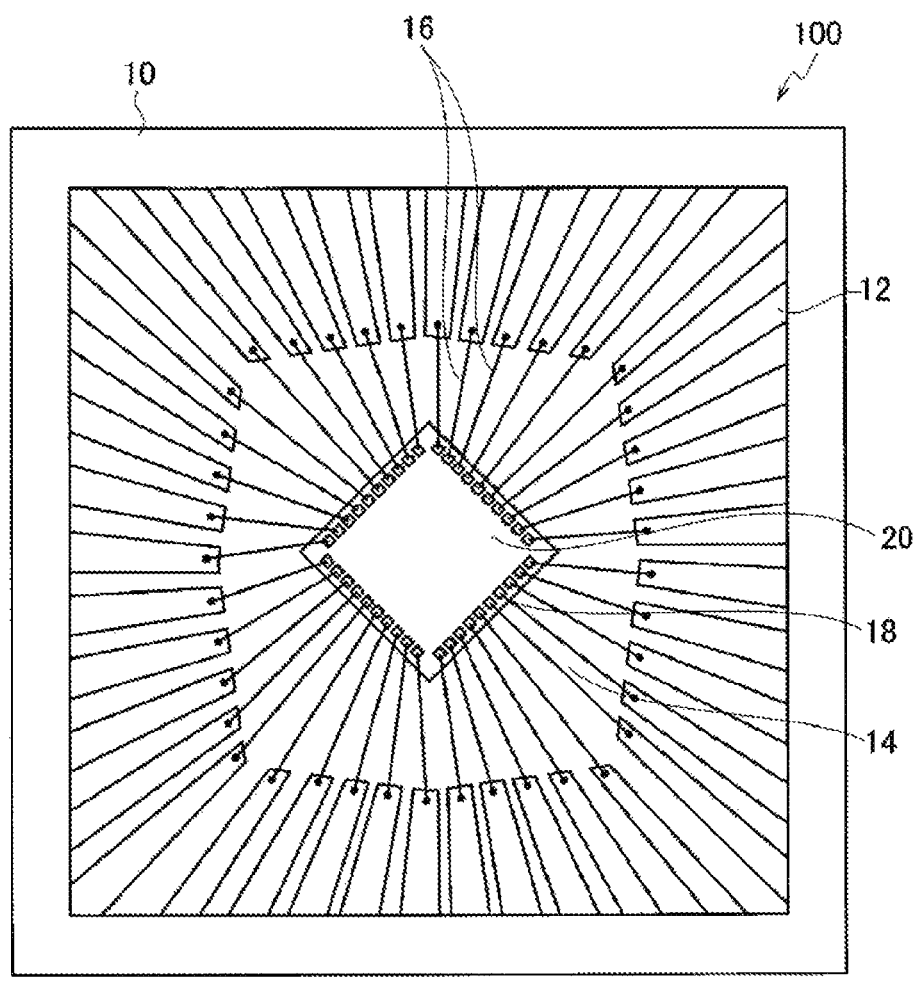
FIG. 10 is a schematic plane view of a package according to a modification of the first embodiment.

A schematic planar configuration of the package 100 according to a modification of the first embodiment is illustrated in FIG. 10. Here, a trace of the front end portions of the lead frames 12 is alleviated at an acute angle with respect to the sides of the semiconductor chip 20. Other components are the same as those of the first embodiment.

Further, in the package 100 according to the modification of the first Embodiment, the bonding wires 16 are respectively bonded to the front end portions of the lead frames 12 at angles ranging from 45 to 135 degrees with respect to the trace of the front end portions of the lead frames 12 in the plane view.

Further, as illustrated in FIG. 10, the sides of the semiconductor chip 20 are disposed at an acute angle equal to or smaller than 45 degrees with respect to the trace of the front end portions of the lead frames 12 in the plane view.

(Second Embodiment)

Figure 12:
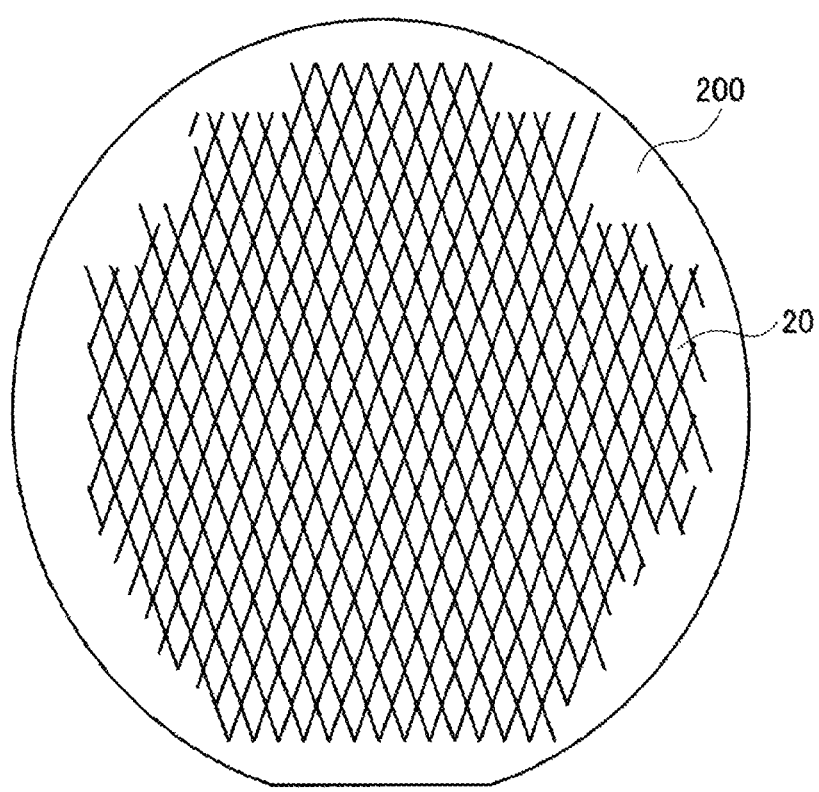
FIG. 12 is a layout view illustrating an example of semiconductor chips mounted in a rectangular package on a wafer according to a second embodiment.

A layout example of a semiconductor chip mounted on a rectangular package 100 in a semiconductor wafer 200 according to a second embodiment is illustrated in FIG. 12. The semiconductor chip 20 mounted on the rectangular package 100 according to the second embodiment has a diamond shape, and thus, the semiconductor chip 20 may be cut out from the semiconductor wafer 200 through a scribing process as illustrated in FIG. 12.

Figure 13:
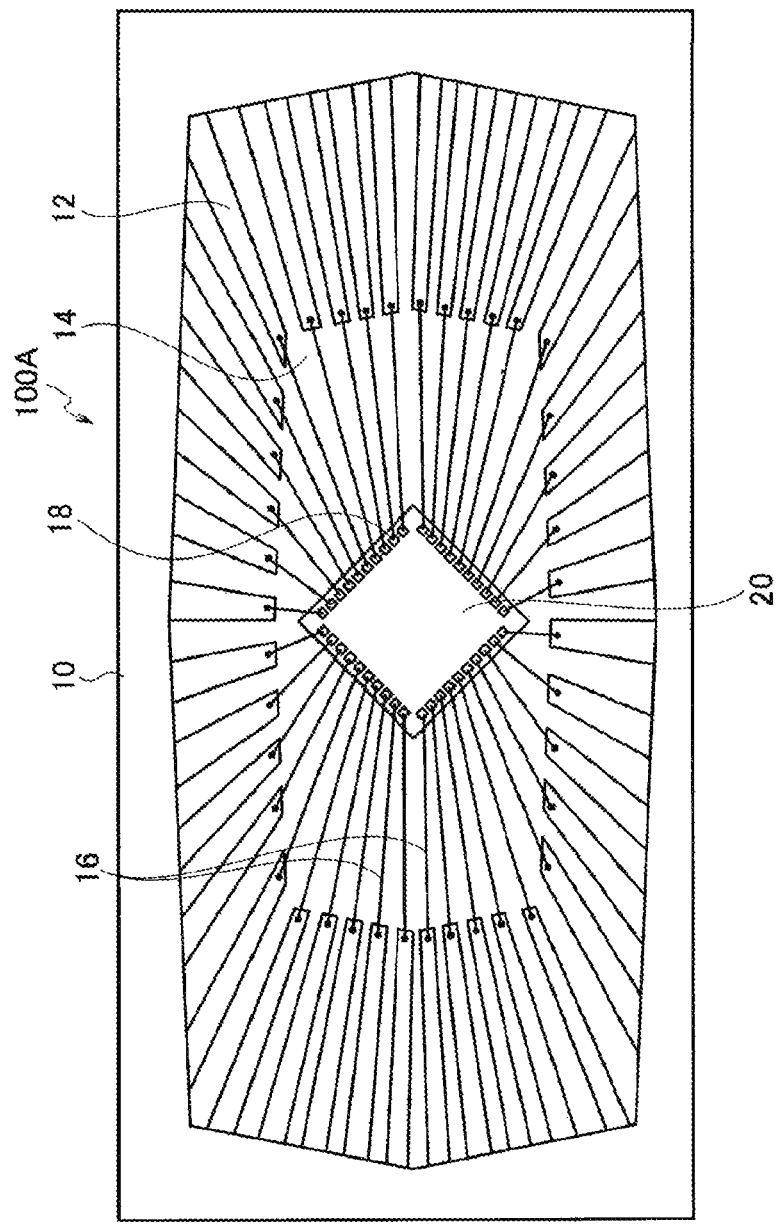
FIG. 13 is a schematic plane view of a rectangular package according to Comparative Example.

Further, a schematic planar configuration of a rectangular package 100A according to Comparative Example is illustrated in FIG. 13. The semiconductor chip 20 mounted on the rectangular package 100A according to the Comparative Example has a square shape, and thus, the semiconductor chip 20 may be cut out from the semiconductor wafer 200 through a scribing process as illustrated in FIG. 6.

As illustrated in FIG. 13, the rectangular package 100A according to Comparative Example includes a plurality of lead frames 12 configured to extend inwardly from an outer circumferential portion 10 of the package, a die pad region 14 surrounded with the lead frames 12 in the plane view, a semiconductor chip 20 mounted on the die pad region 14, a plurality of bonding pads 18 disposed on the semiconductor chip 20, and a plurality of bonding wires 16 configured to connect the plurality lead frames 12 and the bonding pads 18, respectively.

Further, in the package 100A according to Comparative Example, angles of the bonded wires 16 are more acute in a direction toward the end of the rectangular shape of the die pad region 14 from the lead frames 12.

Figure 14:
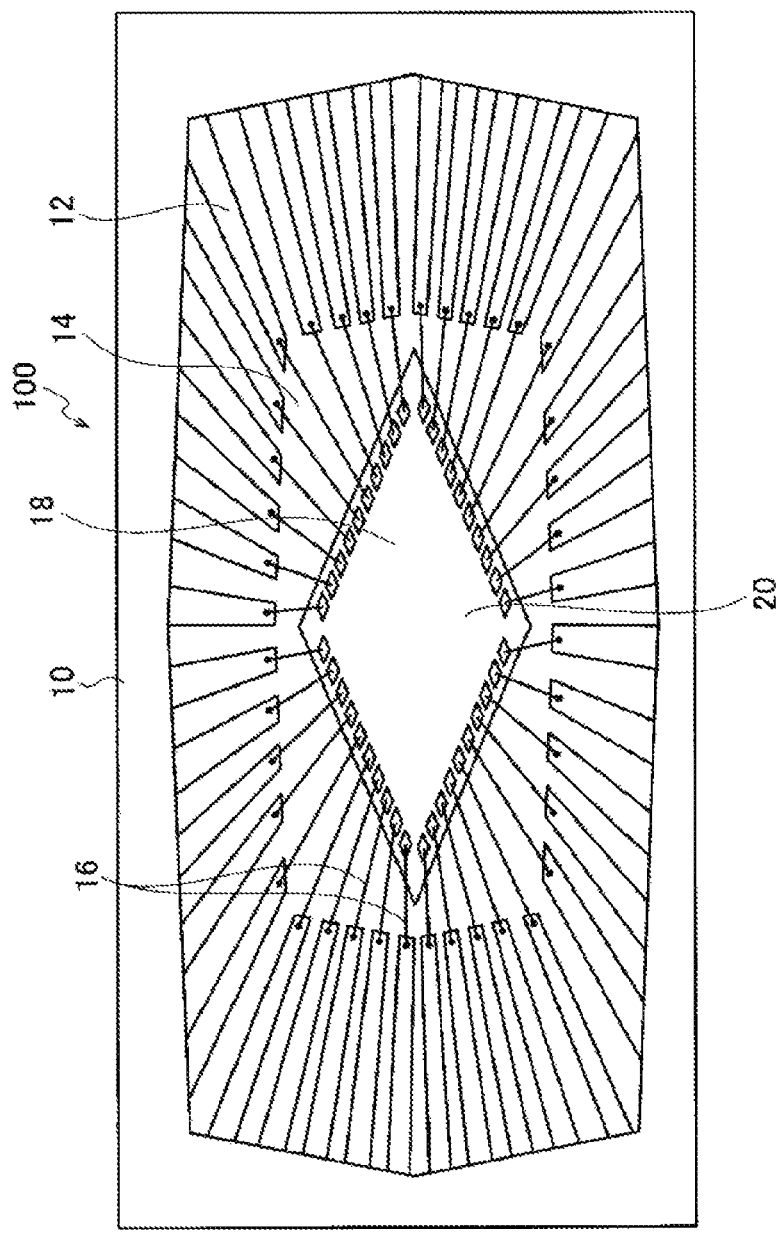
FIG. 14 is another schematic plane view of the rectangular package according to the second embodiment.

A schematic planar configuration of the rectangular package 100 according to the second embodiment is illustrated in FIG. 14.

As illustrated in FIG. 14, the rectangular package 100 according to the second embodiment includes a plurality of lead frames 12 configured to extend inwardly from an outer circumferential portion 10 of the package, a die pad region 14 surrounded with the lead frames 12 in the plane view, a semiconductor chip 20 mounted on the die pad region 14, a plurality of bonding pads 18 disposed on the semiconductor chip 20, and a plurality of bonding wires 16 configured to connect the lead frames 12 and the bonding pads 18, respectively.

Here, the bonding wires 16 are respectively bonded to the front end portions of the lead frames 12 at angles ranging from 45 to 135 degrees with respect to a trace of front end portions of the lead frames 12 in the plane view.

Here, the die pad region 14 has a rectangular shape, and the semiconductor chip 20 has a diamond shape in which a longer diagonal line is parallel to a direction of a longer side of the rectangular shape.

Further, the sides of the semiconductor chip may be placed at an acute angle equal to or smaller than 45 degrees with respect to a trace of front end portions of the lead frames disposed in a direction of the longer side of the rectangular shape in the plane view.

In the rectangular package 100 according to the second embodiment, since the semiconductor chip has the diamond shape, the angles of the bonded wires are greater than those of the comparative example illustrated in FIG. 13 in a direction toward the end of the longer side of the rectangular LSI chip, reducing the risk of a short-circuit defect between the bonding wires and the lead frame adjacent to each other or between adjacent bonding wires.

As described above, according to the package of the embodiment of the present disclosure, the contact (short) between the bonding wires and the lead frame adjacent to each other or between the adjacent bonding wires can be improved by changing a chip mounting and wafer dicing method.

As described above, according to the present disclosure, a package in which an adjacent short is prevented can be provided.

[Other Embodiments]

The present disclosure has been described according to the embodiments, but the descriptions and drawings that constitute part of the present disclosure are merely illustrative and should not be understood as a limitation of the present disclosure. From the present disclosure, various substitute embodiments, examples, and operating techniques will become apparent to a person skilled in the art.

As described above, the present disclosure includes various embodiments and the like that are not disclosed herein.

The mounting package for double-sided connection of the present disclosure allows a PCB to be disposed in a narrow space and is applicable to an IC advantageously mounted on a PCB having an interface capable of receiving data (signal) or power from outside or supplying data (signal) or power to the outside, and thus, the mounting package may be applicable to various applications fields such as personal computers, cellular phones, tablet PCs or the like.

According to the present disclosure in some embodiments, it is possible to provide a package in which an adjacent short-circuit can be prevented.

While certain embodiments have been described, these embodiments have been presented by way of example only, and are not intended to limit the scope of the disclosures.

Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A package, comprising:
   a plurality of lead frames configured to extend inwardly from an outer circumferential portion of the package, and including a first lead frame and a second lead frame adjacent to the first lead frame;
   a die pad region surrounded with the plurality of lead frames in a plane view;
   a semiconductor chip mounted on the die pad region, and having a vertex at which a first side and a second side of the semiconductor chip meet;
   a plurality of bonding pads disposed on the semiconductor chip and at the sides of the semiconductor chip, and including a first bonding pad formed on the first side of the semiconductor chip closest to the vertex and a second bonding pad formed on the second side of the semiconductor chip closest to the vertex; and
   a plurality of bonding wires configured to connect the plurality of lead frames and the plurality of bonding pads, respectively,
   wherein the semiconductor chip is disposed at a location below where the plurality of lead frames are disposed, and is mounted on the die pad region at a bottom of the package,
   wherein the plurality of bonding wires connects front end portions of the plurality of lead frames, which are disposed higher than the plurality of bonding pads within the package, and the plurality of bonding pads, respectively,
   wherein the semiconductor chip has a square shape in the plane view,
   wherein the semiconductor chip is disposed at a 45 degree angle with respect to the outer circumferential portion of the package in the plane view, and
   wherein the first lead frame is connected to the first bonding pad and the second lead frame is connected to the second bonding pad.

2. The package of claim 1, wherein the die pad region has a square shape in the plane view.

3. The package of claim 1, wherein the package is a quad flat package (QFP).

4. A package, comprising:
   a plurality of lead frames configured to extend inwardly from an outer circumferential portion of the package, and including a first lead frame and a second lead frame adjacent to the first lead frame;
   a die pad region surrounded with the plurality of lead frames in a plane view;
   a semiconductor chip mounted on the die pad region, and having a vertex at which a first side and a second side of the semiconductor chip meet;
   a plurality of bonding pads disposed on the semiconductor chip and at the sides of the semiconductor chip, and including a first bonding pad formed on the first side of the semiconductor chip closest to the vertex and a second bonding pad formed on the second side of the semiconductor chip closest to the vertex; and
   a plurality of bonding wires configured to connect the plurality of lead frames and the plurality of bonding pads, respectively,
   wherein the semiconductor chip is disposed at a location below where the plurality of lead frames are disposed, and is mounted on the die pad region at a bottom of the package,
   wherein the plurality of bonding wires connects front end portions of the plurality of lead frames, which are disposed higher than the plurality of bonding pads within the package, and the plurality of bonding pads, respectively,
   wherein the die pad region has a rectangular shape in the plane view,
   wherein the semiconductor chip has a diamond shape in which a longer diagonal line is parallel to a direction of a longer side of the rectangular shape, and
   wherein the first lead frame is connected to the first bonding pad and the second lead frame is connected to the second bonding pad.

5. The package of claim 4, wherein the package is a quad flat package (QFP).

* * * * *